(12) United States Patent
Gong

(10) Patent No.: US 11,520,231 B2
(45) Date of Patent: Dec. 6, 2022

(54) FLEXIBLE DISPLAY SUBSTRATE AND METHOD FOR MANUFACTURING THE SAME

(71) Applicant: Wuhan China Star Optoelectronics Semiconductor Display Technology Co., Ltd., Wuhan (CN)

(72) Inventor: Wenliang Gong, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 705 days.

(21) Appl. No.: 16/481,571

(22) PCT Filed: Nov. 22, 2018

(86) PCT No.: PCT/CN2018/116906
§ 371 (c)(1),
(2) Date: Jul. 29, 2019

(87) PCT Pub. No.: WO2020/082480
PCT Pub. Date: Apr. 30, 2020

(65) Prior Publication Data
US 2021/0356864 A1    Nov. 18, 2021

(30) Foreign Application Priority Data
Oct. 23, 2018  (CN) .......................... 201811236318.4

(51) Int. Cl.
| | | |
|---|---|---|
| *G03F 1/00* | (2012.01) | |
| *C08F 2/46* | (2006.01) | |
| *C08F 2/50* | (2006.01) | |
| *C08G 61/04* | (2006.01) | |
| *G03F 7/028* | (2006.01) | |
| *C08F 222/10* | (2006.01) | |
| *C08F 265/06* | (2006.01) | |
| *C08K 5/315* | (2006.01) | |
| *G03F 7/00* | (2006.01) | |

(52) U.S. Cl.
CPC ............... *G03F 7/028* (2013.01); *C08F 2/50* (2013.01); *C08F 222/102* (2020.02); *C08F 222/103* (2020.02); *C08F 265/06* (2013.01); *C08K 5/315* (2013.01); *G03F 7/0007* (2013.01)

(58) Field of Classification Search
CPC .............. C08F 222/102; C08F 222/103; C08F 222/1063; C08F 265/06; C08F 2/44; C08F 2/50; C08F 220/14; C08F 220/102; G03F 7/028; G03F 7/16; G03F 7/031; G03F 7/027; G03F 7/0007
USPC ............. 430/7, 6, 4; 522/6, 189, 184, 71, 1; 520/1
See application file for complete search history.

(56) References Cited

U.S. PATENT DOCUMENTS

| | | | |
|---|---|---|---|
| 5,362,603 | A | 11/1994 | Katoh et al. |
| 6,627,385 | B2 | 9/2003 | Hiller et al. |
| 2019/0225885 | A1 | 7/2019 | Zhang |

FOREIGN PATENT DOCUMENTS

| | | | |
|---|---|---|---|
| CN | 1508574 | | 6/2004 |
| CN | 101231466 A | | 7/2008 |
| CN | 101416112 | * | 4/2009 |
| CN | 102167760 | | 8/2011 |
| CN | 102870041 | | 1/2013 |
| CN | 104808441 | * | 7/2015 |
| CN | 104808443 A | | 7/2015 |
| CN | 106661151 | | 5/2017 |
| CN | 106872252 A | | 6/2017 |
| CN | 108255016 A | | 7/2018 |
| JP | 2001290265 A | | 10/2001 |

OTHER PUBLICATIONS

De Keyzer et al, CN 101416112 Machine Translation, Apr. 22, 2009 (Year: 2009).*
Zhao, CN 104808441 Machine Translation, Jul. 29, 2015 (Year: 2015).*

* cited by examiner

*Primary Examiner* — Jessica Whiteley
(74) *Attorney, Agent, or Firm* — PV IP PC; Wei Te Chung; Ude Lu

(57) ABSTRACT

A photosensitive resin composition is provided. The photosensitive resin composition is applied in a technical field of flexible display devices. The photosensitive resin composition comprises 5 to 50 parts by weight of an acrylate crosslink monomer, 0.2 to 0.6 parts by weight of an initiator, 5 to 8 parts by weight of a liquid pigment solid substance, 5 to 8 parts by weight of a resin, and 20 to 70 parts by weight of a solvent. The initiator is a radical initiator having a decomposition temperature less than 40° C. The acrylate crosslink monomer comprises a copolymerization two of aromatic group-containing and triol-containing acrylate polymerizable monomers for lowering a temperature of a following color filter preparing process. A method of preparing the photosensitive resin composition and a display device comprising the photosensitive resin composition are also provided.

11 Claims, 3 Drawing Sheets

FLEXIBLE DISPLAY SUBSTRATE AND METHOD FOR MANUFACTURING THE SAME

FIELD OF INVENTION

This disclosure relates to display technology, and particularly to a photosensitive resin composition, display device and method of preparing same.

BACKGROUND OF INVENTION

Flexible displays are considered to be a core competing technology of OLED technology to completely replace liquid crystal displays. Flexible OLED (FOLED) requires flexibility in each functional layer of the flexible OLED. In order to improve the contrast of a panel under strong outdoor light, it is necessary to add a polarizer layer (hereinafter, POL). However, the polarizer layer itself has a low light transmittance (only about 42%), a large thickness (about 100 micrometers), and a hard and brittle texture. A polarizer layer bonded on the organic light emitting diode panel not only causes the short life of the organic light emitting diode, but also not conducive to the development of dynamic bending display products.

Replacing the polarizer with a color filter film (hereinafter, CF) can reduce the thickness of the organic light emitting diode display device and reduce power consumption. In 2011, Kim et al. disclosed a polymer cross-linking monomer, which constitutes a low temperature color filter (LTCF) process by heating and ultraviolet light, achieving low power consumption in flexible display technology (Sunkook Kim et al Adv. Mater. 2011, 23, 3511-3516). The use of the color filter film and the microcavity of the organic light emitting diode display device in replace of the polarizer layer can not only effectively maintain the contrast of the display device under strong light (for example, outdoor), but is more advantageous for flexible display, and can greatly reduce the power consumption of the display device. Conventional color filter films require a baking process in which photoresist component requires a temperature exceeding 200° C. during a preparation process to crosslink the polymer into a film. However, main functional layers (hole transport layer, light-emitting layer, electron transport layer, etc.) in the display device are mostly composed of organic materials, which are very sensitive to heat. Such a high temperature tends to cause irreversible changes in the organic material, and also cause irreversible damage to the functional layers. Therefore, the high temperature poses a greater risk of damage to the display device. Studies have shown that OLED panels can withstand a temperature of 90° C., above which it is extremely easy to cause irreversibly damage to the OLED panel. Thus, reducing the temperature of the color film in the preparation process produces great significance for the development of the color film-based depolarizer technology and its corresponding dynamic flexible product.

Therefore, it is necessary to provide a photosensitive resin composition capable of performing cross-linking polymerization at a lower hardening temperature in a process of preparing a color filter film.

SUMMARY OF INVENTION

A conventional color filter film preparation method needs to be carried out in a process with a high temperature, which may cause damage to other functional layers in the display device.

In order to solve the above drawbacks, the disclosure provides a photosensitive resin composition, which comprises 5 to 50 parts by weight of an acrylate crosslink monomer, 0.2 to 0.6 parts by weight of an initiator, 5 to 8 parts by weight of a liquid pigment solid substance, 5 to 8 parts by weight of a resin, and 20 to 70 parts by weight of a solvent. The acrylate crosslink monomer comprises a copolymerization of two aromatic group-containing and triol-containing acrylate polymerizable monomers, the two aromatic group-containing and triol-containing acrylate polymerizable monomers are in a form of mutually symmetrical structure, one end of triol of one of the aromatic group-containing and triol-containing acrylate polymerizable monomer is bonded to an aromatic group of the one of the aromatic group-containing and triol-containing acrylate polymerizable monomer, the other end of the triol of the aromatic group-containing and triol-containing acrylate polymerizable monomer is bonded to triol of another aromatic group-containing and triol-containing acrylate polymerizable monomer.

According to an embodiment of the photosensitive resin composition described in the disclosure, the initiator is a radical initiator having a decomposition temperature less than 40° C.

According to an embodiment of the photosensitive resin composition described in the disclosure, the initiator is azobisisoheptanenitrile.

According to an embodiment of the photosensitive resin composition described in the disclosure, the photosensitive resin composition further comprises 5 to 8 parts by weight of a dispersing agent and 0.1 to 0.2 parts by weight of an additive.

According to an embodiment of the photosensitive resin composition described in the disclosure, the triol is glycerin.

According to an embodiment of the photosensitive resin composition described in the disclosure, the aromatic group is selected from the group consisting of a benzene ring, a heterocyclic group, and a phenoxy group.

In order to solve the above drawbacks, the disclosure further provides a photosensitive resin composition, which comprises 5 to 50 parts by weight of an acrylate crosslink monomer, 0.2 to 0.6 parts by weight of an initiator, 5 to 8 parts by weight of a liquid pigment solid substance, 5 to 8 parts by weight of a resin, and 20 to 70 parts by weight of a solvent. The acrylate crosslink monomer comprises a copolymerization of two aromatic group-containing and triol-containing acrylate polymerizable monomers.

According to an embodiment of the photosensitive resin composition described in the disclosure, the initiator is a radical initiator having a decomposition temperature less than 40° C.

According to an embodiment of the photosensitive resin composition described in the disclosure, the initiator is azobisisoheptanenitrile.

According to an embodiment of the photosensitive resin composition described in the disclosure, the photosensitive resin composition further comprises 5 to 8 parts by weight of a dispersing agent and 0.1 to 0.2 parts by weight of an additive.

According to an embodiment of the photosensitive resin composition described in the disclosure, the triol is glycerin.

According to an embodiment of the photosensitive resin composition described in the disclosure, the aromatic group is selected from the group consisting of a benzene ring, a heterocyclic group, and a phenoxy group.

To achieve the above object, the disclosure further provides a method of preparing a photosensitive resin composition. The method comprises following steps of:

providing an acrylate crosslink monomer, wherein the acrylate crosslink monomer comprises a copolymerization of two aromatic group-containing and triol-containing acrylate polymerizable monomers;

providing an initiator and mixing the initiator with the acrylate crosslink monomer, and placing the acrylate crosslink monomer containing the initiator in a constant temperature water bath at 40° C. and irradiating the acrylate crosslink monomer containing the initiator with ultraviolet light for at least 6 hours; and obtaining the photosensitive resin composition by mixing a liquid pigment solid substance, a resin, a solvent, a dispersing agent, and an additive with the acrylate crosslink monomer containing the initiator.

In order to solve the above drawbacks, the disclosure further provides a liquid crystal display device comprising the backlight module as above mentioned.

According to an embodiment of the method described in the disclosure, the step of providing the acrylate crosslink monomer further comprises:

removing a polymerization inhibitor in the acrylate crosslink monomer by a column chromatography method;

removing dichloromethane in the acrylate crosslink monomer by a distillation method.

According to an embodiment of the method described in the disclosure, the initiator is a radical initiator having a decomposition temperature less than 40° C., and the initiator is azobisisoheptonitrile.

According to an embodiment of the method described in the disclosure, the triol is glycerin.

According to an embodiment of the method described in the disclosure, the aromatic group is selected from the group of a benzene ring, a heterocyclic group, and a phenoxy group.

In order to solve the above drawbacks, the disclosure further provides a color filter prepared by the above-mentioned method. Also, the disclosure further provides a display device. The display device comprises a color filter including a photosensitive resin composition prepared by the above-mentioned method.

According to the photosensitive resin composition of the disclosure, since the polymerizable monomer containing a benzene ring is added, the absorption efficiency of the polymerizable monomer to ultraviolet light is improved, and the reactivity of the polymerizable monomer is increased. The initiator is a radical initiator having a decomposition temperature less than 40° C., which lowers a thermal initiation temperature (polymerization temperature) of the polymerization and crosslinking reaction in the color filter preparing process, and increases the polymerization efficiency at the same time. Further, by selecting the polymerizable monomer and the initiator, the thermal initiation temperature of the polymerization and crosslinking reaction is controlled at 40° C. and below, further reducing the reaction temperature of the polymerization and crosslinking reaction and increasing the efficiency of polymerization of the polymerizable monomer. It is therefore to apply a color filter comprising the photosensitive resin composition of the disclosure to the preparation of an OLED display device, an LCD display device, and a flexible display device.

DETAILED DESCRIPTION OF PREFERRED EMBODIMENTS

To make the above embodiments of the invention more comprehensible, the preferred embodiments being adopted by the present invention to achieve the above and other objectives can be best understood by referring to the following detailed description of the preferred embodiments and the accompanying drawings as detailed below.

The embodiments are chosen and described in order to best explain the principles of the present invention; it is to be understood that the present invention is not limited thereto.

Conventional color filter preparing process requires a polymerization crosslinking reaction of a polyfunctional monomer at a higher temperature (over 200° C.) to prepare a color filter functional layer. An organic light emitting diode display device is extremely sensitive to high temperatures, and excessive temperature causes irreversible damage of the display device, and therefore, the baking temperature of the color filter preparing process must be lowered. In response to this problem, the disclosure provides a polyfunctional polymerizable monomer molecule and a corresponding initiator such that the polymerizable monomer has a lower thermal initiation temperature (40° C. and below 40° C.) in the color filter preparing process, thereby reducing the damage of the display device caused by the excessive temperature.

Figure 1:
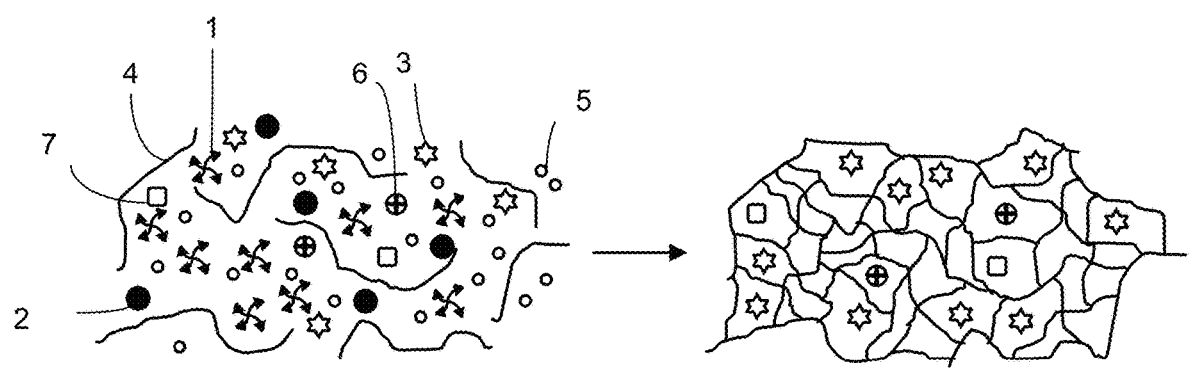
FIG. 1 is a crosslinking schematic diagram of a photosensitive resin composition of the disclosure.

Referring to FIG. 1, a crosslinking schematic diagram of a photosensitive resin composition of the disclosure is shown. The disclosure provides a photosensitive resin composition, which comprises 5 to 50 parts by weight of an acrylate crosslink monomer 1, 0.2 to 0.6 parts by weight of an initiator 2, 5 to 8 parts by weight of a liquid pigment solid substance 3, 5 to 8 parts by weight of a resin 4, 20 to 70 parts by weight of a solvent 5, 5 to 8 parts by weight of a dispersing agent 6 and 0.1 to 0.2 parts by weight of an additive 7. The initiator is a radical initiator having a decomposition temperature less than 40° C. The acrylate crosslink monomer comprises a copolymerization two of aromatic group-containing and triol-containing acrylate polymerizable monomers for lowering a temperature of a following color filter preparing process.

As shown in the following formula (1), the molecular structural formula of the acrylate crosslink monomer in the disclosure is shown. The acrylate crosslink monomer is composed of two acrylate polymerizable monomer molecules, the acrylate polymerizable monomer molecule includes an acrylate, which is linked to a triol molecule. In this embodiment, the triol molecule is glycerin, but is not limited thereto. The glycerin is used as a linking unit, and one end of the glycerin is modified to connect an aromatic group. The aromatic group is selected from the group consisting of a benzene ring, a heterocyclic group, and a phenoxy group (for example the aromatic group is a benzene ring, but not limited thereto). The other end of the glycerin is connected to another acrylate polymerizable monomer molecule symmetrically. The acrylate crosslink monomer comprises a plurality of acrylate polymerizable monomer molecules having a polymerization function.

(1)

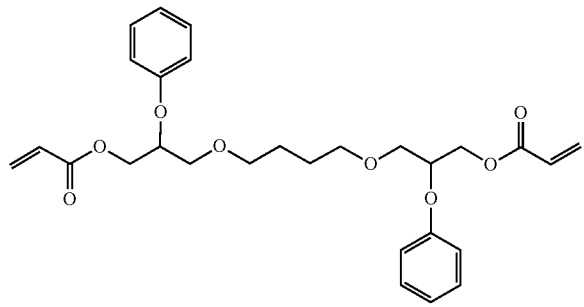

It should be noted that since the conventional acrylate crosslink monomer does not contain a benzene ring (or an aromatic fused ring unit), it has a poor ability in ultraviolet absorbing. By introducing a phenoxy group, the ability of the acrylate crosslink monomer can be remarkably improved in ultraviolet absorbing and the activation energy of the polymerization reaction can be reduced, thereby lowering the thermal initiation temperature (polymerization temperature) of the polymerization reaction.

According to the photosensitive resin composition of the disclosure, the resin is preferably an alkali-soluble resin, and further preferably an acrylate-based resin. The monomer is a polymerizable monomer, preferably an acrylate polymerizable monomer. The solvent is preferably propylene glycol methyl ether acetate, propylene glycol methyl ether and/or propylene glycol acetate. Since most of ingredients in the composition are solutions containing a solid component, and the solid component therein is an active ingredient, a ratio of the solid component is used as a standard for adjusting other compositions. The monomer, the resin, the solvent and the liquid pigment solid substance are in liquid form, The solid component added is used to be a the standard.

According to the photosensitive resin composition of the disclosure, the initiator is a radical initiator having a decomposition temperature less than 40° C., and further, the initiator is azobisisoheptonitrile. It should be noted that in the conventional polymerization the acrylate monomers generally use azodiisobutyronitrile (AIBN) as an initiator under heating conditions, and AIBN forms a radical to induce polymerization of the acrylate monomers (radical polymerization). Compared with AIBN, the initiator of the disclosure, as shown in the following formula (2), is azodiisoheptanenitrile (2,2'-Azobis-(2,4-dimethylvaleronitrile), abbreviated as ABVN). The chemical structural formula of isoheptonitrile, as an analogue of azobisisobutyronitrile, is more unstable to heat and freer to generate free radicals and the activity of the generated free radicals is higher. Thus, AIBN is often used for low temperature initiated free radical polymerization. The thermal initiation temperature (polymerization temperature) at which the polymerization reaction is lowered can also be achieved.

(2)

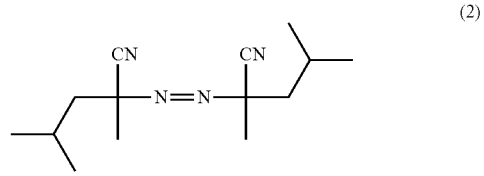 [SMILES: CC(C)CC(C)(C#N)N=NC(C)(C#N)CC(C)C]

Therefore, the disclosure provides an acrylate crosslink monomer composed of acrylate polymerizable monomer molecules and the selection of the initiator for lowering the relatively high curing temperature (200° C.) in the conventional technology to 40° C. or lower. The temperature of the color filter preparing process is greatly reduced.

Figure 2:
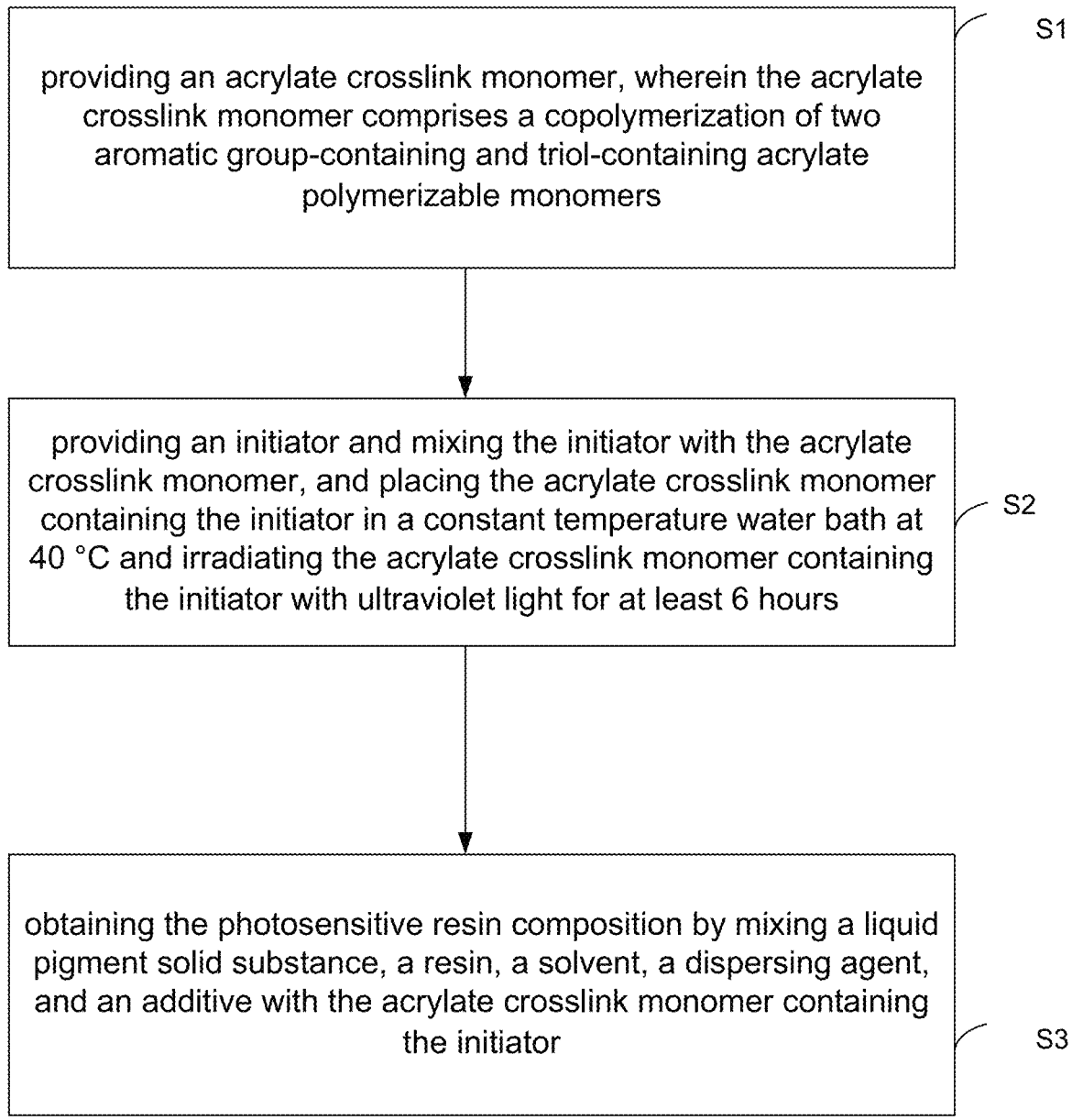
FIG. 2 is a flowchart of a method of preparing a photosensitive resin composition of the disclosure.

Referring to FIG. 2, a flowchart of a method of preparing a photosensitive resin composition of the disclosure is shown. The disclosure provides a method of preparing a photosensitive resin composition. The method comprises following steps.

In a step S1, an acrylate crosslink monomer is provided. The acrylate crosslink monomer comprises a copolymerization of two aromatic group-containing and triol-containing acrylate polymerizable monomers.

In a step S2, an initiator is provided and the initiator is mixed with the acrylate crosslink monomer. The acrylate crosslink monomer containing the initiator is placed in a constant temperature water bath at 40° C. and the acrylate crosslink monomer containing the initiator is irradiated with ultraviolet light for at least 6 hours.

In a step S3, a pigment-liquid solid, a resin, a solvent, a dispersing agent, and an additive are mixed with the acrylate crosslink monomer containing the initiator to obtain the photosensitive resin composition.

In more detail, under the irradiation of ultraviolet light having a wavelength of 365 nm and at a temperature of 40° C., before the step of providing the acrylate crosslink monomer, the method further comprises a sub-step of removing a polymerization inhibitor in the acrylate crosslink monomer by a column chromatography method. A solution containing the acrylate polymerizable monomer molecules is uniformly passed through a column packed with a basic alumina filler to remove the polymerization inhibitor in the acrylate polymerizable monomer molecules. The method further comprises a sub-step of removing dichloromethane in the acrylate crosslink monomer by a distillation method. The distillation method comprises that distilling the solution containing the acrylate polymerizable monomer molecules after the removal of the polymerization inhibitor at room temperature under a reduced pressure for 3 hours.

Thereafter, in order to verify that the acrylate crosslink monomer can be polymerized at 40° C. or lower to form the photosensitive resin composition and further constituting a color filter. 1 ml of the acrylate crosslink monomer is placed in each of sample bottles, and the initiator azobisisoheptanenitrile (ABVN) was weighed 2 mg and 5 mg, respectively, and added into each of the sample bottles to mix with the acrylate crosslink monomer and to fully dissolve the initiator among the acrylate crosslink monomers.

The acrylate crosslink monomer containing azobisisoheptanenitrile (ABVN) was placed in a constant temperature water bath at 40° C., and the monomer polymerization was continued by continuously treating for 6 hours under ultraviolet light at a wavelength of 365 nm. After application of ultraviolet light and water bath, the acrylate crosslink monomer changes from a viscous liquid to a transparent solid, that is, the acrylate crosslink monomer is polymerized from a small molecular state to form a polymer constituting the photosensitive resin composition.

In other embodiments, it can be found that a sample of the acrylate crosslink monomer to which 5 mg of the initiator was added polymerized at a significantly faster rate than a sample of the acrylate crosslink monomer to which 2 mg of the initiator was added. The sample of the acrylate crosslink monomer with 5 mg of initiator added shows better degree of polymerization. A copolymerization effect of the acrylate crosslink monomer is verified by another experimental embodiment below.

Example—Copolymerization of Acrylate Crosslink Monomer with Methyl Methacrylate (MMA)

Different content of acrylate crosslink monomer and methyl methacrylate (MMA) under ultraviolet light with a wavelength of 365 nm, polymerization temperature of 40° C., and azobisisoheptanenitrile (ABVN) (2 mg/ml) are mixed and polymerized for 6 hours. The content of acrylate crosslink monomer is 5%, 10%, 25%, 50%, and 100% by weight, respectively.

The acrylate crosslink monomers treated by the above-mentioned column chromatography method and distillation method are respectively placed in a sample bottle and mixed with a methyl methacrylate monomer. The weight percentage of the acrylate crosslink monomer is 5%, 10%, 25%, 50%, and 100%.

Figure 3:
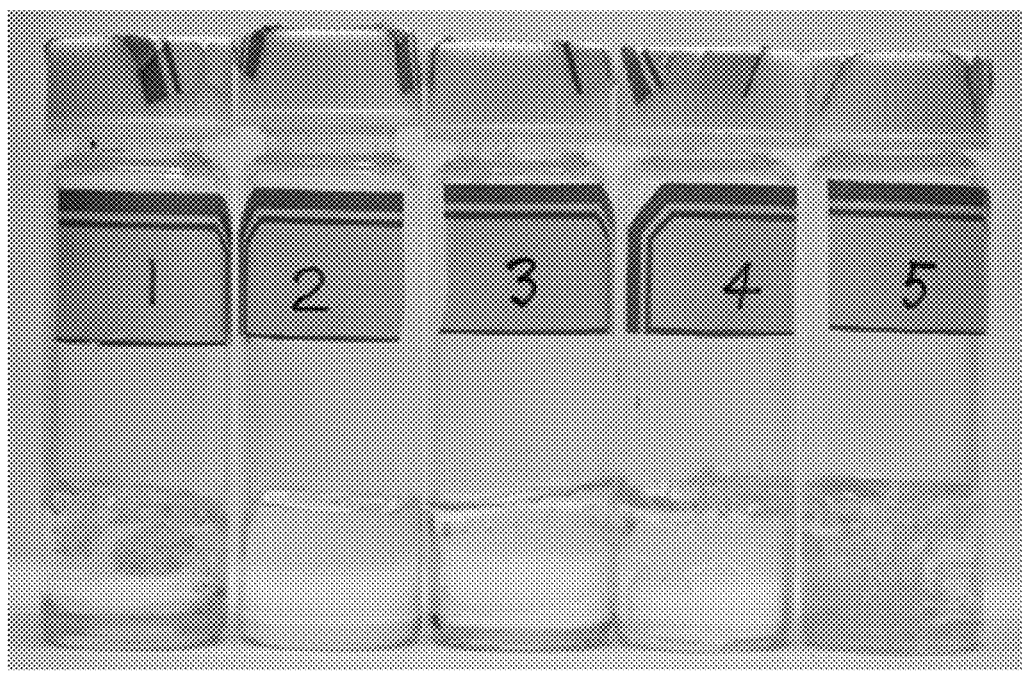
FIG. 3 is a schematic diagram of copolymerization of acrylate crosslink monomer with methyl methacrylate (MMA) of the disclosure.

Thereafter, the initiator azobisisoheptanenitrile (ABVN) (2 mg/ml) was respectively added into the sample bottles containing the acrylate crosslink monomers, and uniformly mixed until the initiator was completely dissolved in the acrylate crosslinking monomer. The sample bottles are sealed and placed in a constant temperature water bath at 40° C. while being irradiated with ultraviolet light having a wavelength of 365 nm for 6 hours. As shown in FIG. 3, a situation of copolymerization of the acrylate crosslink monomer and methyl methacrylate (MMA) is obtained. The higher the content of the acrylate crosslinking monomer, the faster the polymerization rate and the higher the degree of polymerization are shown.

In addition, the disclosure further provides a color filter prepared by the above-mentioned method. Also, the disclosure further provides a display device. The display device comprises a color filter including a photosensitive resin composition prepared by the above-mentioned method.

According to the photosensitive resin composition of the disclosure, since the polymerizable monomer containing a benzene ring (or phenoxy group, or aromatic fused ring unit) is added, the absorption efficiency of the polymerizable monomer to ultraviolet light is improved, and the reactivity of the polymerizable monomer is increased. The initiator (ABVN) is a radical initiator having a decomposition temperature less than 40° C., which lowers a thermal initiation temperature (polymerization temperature) of the polymerization and crosslinking reaction in the color filter preparing process, and increases the polymerization efficiency at the same time. Further, by selecting the polymerizable monomer and the initiator, the thermal initiation temperature of the polymerization and crosslinking reaction is controlled at 40° C. and below, further reducing the reaction temperature of the polymerization and crosslinking reaction and increasing the efficiency of polymerization of the polymerizable monomer. It is therefore to apply a color filter comprising the photosensitive resin composition of the disclosure to the preparation of an OLED display device, an LCD display device, and a flexible display device.

This disclosure has been described with preferred embodiments thereof, and it is understood that many changes and modifications to the described embodiment can be carried out without departing from the scope and the spirit of the invention.

What is claimed is:
1. A photosensitive resin composition, comprising:
5 to 50 parts by weight of an acrylate crosslink monomer, 0.2 to 0.6 parts by weight of an initiator, 5 to 8 parts by weight of a pigment solid substance, 5 to 8 parts by weight of a resin, and 20 to 70 parts by weight of a solvent;
wherein the acrylate crosslink monomer comprises a copolymerization of two aromatic group-containing and triol-containing acrylate polymerizable monomers, the two aromatic group-containing and triol-containing acrylate polymerizable monomers are in a form of mutually symmetrical structure, one end of triol of one of the aromatic group-containing and triol-containing acrylate polymerizable monomer is bonded to an aromatic group of the one of the aromatic group-containing and triol-containing acrylate polymerizable monomer, the other end of the triol of the aromatic group-containing and triol-containing acrylate polymerizable monomer is bonded to triol of another aromatic group-containing and triol-containing acrylate polymerizable monomer;
wherein the triol is glycerin, the aromatic group is selected from the group consisting of a benzene ring, a heterocyclic group, and a phenoxy group, and one end of the glycerin is modified to connect an aromatic group, the other end of the glycerin is connected to another acrylate polymerizable monomer molecule symmetrically.

2. The photosensitive resin composition according to claim 1, wherein the initiator is a radical initiator having a decomposition temperature less than 40° C.

3. The photosensitive resin composition according to claim 1, wherein the initiator is azobisisoheptanenitrile.

4. The photosensitive resin composition according to claim 1, wherein the photosensitive resin composition further comprises 5 to 8 parts by weight of a dispersing agent and 0.1 to 0.2 parts by weight of an additive.

5. A photosensitive resin composition, comprising:
5 to 50 parts by weight of an acrylate crosslink monomer, 0.2 to 0.6 parts by weight of an initiator, 5 to 8 parts by weight of a pigment solid substance, 5 to 8 parts by weight of a resin, and 20 to 70 parts by weight of a solvent;
wherein the acrylate crosslink monomer comprises a copolymerization of two aromatic group-containing and triol-containing acrylate polymerizable monomers;
wherein the triol is glycerin, the aromatic group is selected from the group consisting of a benzene ring, a heterocyclic group, and a phenoxy group, and one end of the glycerin is modified to connect an aromatic group, the other end of the glycerin is connected to another acrylate polymerizable monomer molecule symmetrically.

6. The photosensitive resin composition according to claim 5, wherein the initiator is a radical initiator having a decomposition temperature less than 40° C.

7. The photosensitive resin composition according to claim 5, wherein the initiator is azobisisoheptanenitrile.

8. The photosensitive resin composition according to claim 5, wherein the photosensitive resin composition further comprises 5 to 8 parts by weight of a dispersing agent and 0.1 to 0.2 parts by weight of an additive.

9. A method of preparing a photosensitive resin composition, comprising:
providing an acrylate crosslink monomer, wherein the acrylate crosslink monomer comprises a copolymerization of two aromatic group-containing and triol-containing acrylate polymerizable monomers, wherein the triol is glycerin, the aromatic group is selected from the group consisting of a benzene ring, a heterocyclic group, and a phenoxy group, and one end of the glycerin is modified to connect an aromatic group, the other end of the glycerin is connected to another acrylate polymerizable monomer molecule symmetrically;

providing an initiator and mixing the initiator with the acrylate crosslink monomer;

placing the acrylate crosslink monomer containing the initiator in a constant temperature water bath at 40° C. and irradiating the acrylate crosslink monomer containing the initiator with ultraviolet light for at least 6 hours; and obtaining the photosensitive resin composition by mixing a pigment solid substance, a resin, a solvent, a dispersing agent, and an additive with the acrylate crosslink monomer containing the initiator.

10. The method of preparing the photosensitive resin composition according to claim 9, wherein the step of providing the acrylate crosslink monomer further comprises:

removing a polymerization inhibitor in the acrylate crosslink monomer by a column chromatography method;

removing dichloromethane in the acrylate crosslink monomerby by a distillation method.

11. The method of preparing the photosensitive resin composition according to claim 9, wherein the initiator is a radical initiator having a decomposition temperature less than 40° C., and the initiator is azobisisoheptonitrile.

\* \* \* \* \*